(12) United States Patent
Rudkowski

(10) Patent No.: US 12,392,799 B2
(45) Date of Patent: Aug. 19, 2025

(54) PROBE UNIT AND HOLDER FOR A PROBE UNIT

(71) Applicant: Carl Mahr Holding GmbH, Goettingen (DE)

(72) Inventor: Matthias Rudkowski, Rhumspringe (DE)

(73) Assignee: CARL MAHR HOLDING GMBH, Goettingen (DE)

( * ) Notice: Subject to any disclaimer, the term of this patent is extended or adjusted under 35 U.S.C. 154(b) by 329 days.

(21) Appl. No.: 18/133,687

(22) Filed: Apr. 12, 2023

(65) Prior Publication Data
US 2023/0333140 A1    Oct. 19, 2023

(30) Foreign Application Priority Data

Apr. 14, 2022  (DE) ...................... 10 2022 109 267.4

(51) Int. Cl.
*G01R 1/067* (2006.01)
*G01R 1/16* (2006.01)

(52) U.S. Cl.
CPC ........... *G01R 1/06705* (2013.01); *G01R 1/16* (2013.01)

(58) Field of Classification Search
CPC ...... G01R 1/067; G01R 1/06705; G01R 1/16; G01R 1/06711; G01R 1/06755;
(Continued)

(56) References Cited

U.S. PATENT DOCUMENTS 6,772,527 B1    8/2004  Butter et al.
9,091,521 B2 *  7/2015  Nakayama ............... G01B 7/34
(Continued)

FOREIGN PATENT DOCUMENTS

DE    102005007003 A1    8/2006
DE    10 2014 107 044 A1  12/2015
(Continued)

OTHER PUBLICATIONS

Japan Patent Office; Notice of Reasons for Rejection in corresponding Japanese Patent Application No. 2023-051460, dated Dec. 22, 2023; 4 pages.
(Continued)

*Primary Examiner* — Son T Le
(74) *Attorney, Agent, or Firm* — Fitch, Even, Tabin & Flannery LLP

(57) ABSTRACT

A probe unit and a holder of a measurement apparatus that can be releasably connected to one another, particularly without tools, are disclosed. The probe unit includes a mounting device having a contact surface and the holder comprises a counter-contact surface assigned to the contact surface. The contact surface can be divided into multiple separate surface sections that respectively abut along a line or two-dimensionally against the assigned counter-contact surface, if the mounting device takes a contact position. The holding force is produced by at least one mounting magnet of the mounting device and/or at least one holding magnet of the holder. Thereby a magnetic axial force in an axial direction as well as a magnetic circumferential force in a circumferential direction around the axial direction is created, so that the mounting device and holder are urged relative to one another in a desired rotational position in the circumferential direction.

16 Claims, 7 Drawing Sheets

(58) Field of Classification Search
CPC ...... G01B 21/04; G01B 21/047; G01B 21/20; G01B 5/00; G01B 5/0004; G01B 5/28; G01B 5/0008
See application file for complete search history.

(56) References Cited

U.S. PATENT DOCUMENTS

| | | | |
|---|---|---|---|
| 9,829,303 B2* | 11/2017 | Yamauchi | G01B 5/00 |
| 10,760,891 B2 | 9/2020 | Steuer | |
| 11,187,521 B2 | 11/2021 | Tobiason | |
| 2014/0331511 A1* | 11/2014 | Yamauchi | G01B 5/28 33/558 |
| 2016/0003270 A1 | 1/2016 | Franklin | |
| 2018/0372470 A1* | 12/2018 | Rudkowski | G01B 3/008 |
| 2019/0101370 A1 | 4/2019 | Karasawa et al. | |

FOREIGN PATENT DOCUMENTS

| | | |
|---|---|---|
| DE | 112012005779 B4 | 5/2016 |
| DE | 102017012202 B4 | 1/2019 |
| DE | 102017106741 B4 | 11/2019 |
| DE | 102018119697 A1 | 2/2020 |
| DE | 102018133220 A1 | 6/2020 |
| DE | 10 2019 218 705 A1 | 6/2021 |
| DE | 102021109449 A1 | 10/2021 |
| EP | 2 224 204 A2 | 9/2010 |
| EP | 2515069 A2 | 10/2012 |
| EP | 2667147 A1 | 11/2013 |
| EP | 2847540 B1 | 9/2016 |
| JP | 3141561 U | 5/2008 |
| JP | 2010-539467 A | 12/2010 |
| WO | 2007/135857 A1 | 10/2009 |
| WO | 2013167168 A1 | 11/2013 |

OTHER PUBLICATIONS

German Patent and Trademark Office; Office Action in corresponding German Patent Application No. 10 2022 109 267.4, dated Jul. 16, 2024, 16 pages.
UK Intellectual Property Office; Office Action and Search Report in corresponding Application No. GB 2305338.2, dated Oct. 13, 2023; 8 pages.
Japan Patent Office; Patent Grant Decision in corresponding Japanese Patent Application No. 2023-051460, dated Jun. 6, 2024, 2 pages.
Wozniak, A., Study of the Repeatability of the Magnetic Joint in the Probes Used in Coordinate Measuring Machines. The International Journal of Advanced Manufacturing Technology 47.9 (2010) 1209-1216, 8 pages.
The German Patent and Trade Mark Office, Office Action for German Patent Application No. 10 2022 109 267.4, dated Sep. 30, 2022; 15 pages.

* cited by examiner

PROBE UNIT AND HOLDER FOR A PROBE UNIT

CROSS REFERENCE TO RELATED APPLICATION

This application claims the benefit of German Patent Application No. 10 2022 109 267.4, filed Apr. 14, 2022, which is incorporated herein by reference in its entirety.

TECHNICAL FIELD

The invention refers to a probe unit and a holder for a probe unit. For example, the holder of the probe unit can be part of a measurement apparatus. A suitable probe unit can be selected depending on the measuring task and can be arranged on the holder. The probe unit can be a probe arm, for example, that is configured for tactile probing with contact and/or for contactless probing of an object and for this purpose carries at its end a tactile probe element or a contactless detecting probe element. The measurement apparatus can be a stylus instrument, for example. The invention also refers to an arrangement comprising a probe unit and a holder.

BACKGROUND

DE 10 2017 012 202 B4 describes a measurement arm as well as a measurement arm holder of a measurement system. The measurement arm holder comprises a holder body having multiple support locations at which the measurement arm abuts when the connection is established. The holding force between the measurement arm and the measurement arm holder is created by means of multiple magnet pairs, whereby one magnet of a magnet pair is respectively arranged at the measurement arm and the respective other magnet is arranged on the measurement arm holder or the holder body. The holder body is substantially cuboid-shaped and the measurement arm has an interface having a cavity adapted to the shape of the holder body.

A measurement device having an optical measurement arrangement is known from DE 10 2018 119 697 A1. The measurement arrangement has an optic with multiple parts that can be connected with one another by means of a positioning arrangement. For this purpose the positioning arrangement has three rotationally symmetric bodies and three corresponding receptacles in order to define the correct position between the two parts of the optic. The holding force between the two parts can be created by means of magnets.

DE 11 2012 005 779 B4 refers to a coordinate measurement apparatus, particularly a so-called laser tracker. The laser tracker can direct a laser beam onto a retro-reflector. In the embodiment the retro-reflector comprises latch elements that can be inserted into matching elements of a probe head in order to define the relative position. The holding force can be created magnetically.

EP 2 515 069 B1 describes a probe arm having a probe arm interface and a holder having an interface matching with the probe arm interface. By means of balls of a probe arm interface that engage into cavities between cylinders at the holder, an exact definition of the relative position is guaranteed when the connection is established. The holding force between the probe arm and the holder can be applied magnetically. A probe arm and a holder for the probe arm having a similar interface is described in DE 10 2017 106 741 B4.

EP 2 847 540 B1 discloses an illumination module and an optic sensor of a coordinate measurement apparatus. The illumination module and the sensor are supported on one another by means of a three-point support and are held on one another by means of a magnetic holding force. The magnet can be a permanent magnet or a switchable electric magnet.

DE 10 2018 133 220 A1 as well as DE 10 2005 007 003 B4 respectively describe an interface for arranging a probe element at a support of the probe unit, particularly a probe arm.

Probe units with exchangeable probe elements are known and are, for example offered by companies Optacom GmbH & Co. KG or Triebworx GmbH & Co. KG.

The probe element for probing the measurement location on an object surface has to be suitable for the measurement task. A tactile probe element is in addition subject to a certain wear. Therefore, it can be desired to exchange the probe element or the probe unit depending on the measurement task or in case of occurring wear. The exchange of the probe element or the probe unit is cumbersome in many known systems. The probe unit is not always accessible from all sides in a simple manner without problems in the installed condition. In addition in some of the known systems the exchange of the probe unit or the probe element results in introducing forces into the measurement apparatus, whereby in turn very filigree components of the measurement apparatus serving for the measurement force creation or the measurement detection are subject to increased, particularly mechanical stress and can be damaged.

SUMMARY

Therefore, it is an object of the present invention to provide a probe unit and a holder of a measurement apparatus, whereby the probe unit can be easily exchanged on the holder, particularly without use of tools.

This object is solved by means of a probe unit, a holder, as well as an arrangement as described herein.

The probe unit for a measurement apparatus according to the invention can be, for example, a probe arm or a probe arm section or can comprise another substantially rod or tube-shaped form. The measurement apparatus is configured to detect a measurement value at a measurement location on an object surface by means of the probe unit. The probe unit, therefore, serves to probe the object surface at the measurement location. Thereby the probe unit can operate in a contacting or contactless manner, e.g. in a tactile or optic manner.

The probe unit has a support. For example, the support can be rod-shaped or tube-shaped. A probe element is arranged on the support. The probe element is configured to contact the object surface at the measurement location in a touching manner or to be directed onto the measurement location on the object surface in a contactless manner. For example, the probe element can emit light or another electromagnetic wave on the measurement location that is reflected there and is again received by means of the probe element.

In addition, a mounting device is provided on the support of the probe unit. The mounting device can be a monolithic part of the support or can be attached on the support. The mounting device is configured to releasably mechanically connect the probe unit with a holder of the measurement apparatus. In addition to the mechanical connection, optionally also a signal transmission connection can be established, e.g. an electrical connection and/or an optical connection.

Particularly the mounting device is configured in a manner, so that it can be connected with the holder of the measurement apparatus without the use of a tool and can be removed from the holder of the measurement apparatus without the use of a tool. Preferably the connection between the mounting device and the holder is free from any threaded connection and/or latched connection.

The mounting device has a contact unit. The contact unit comprises a contact surface. The contact unit and particularly the contact surface define a first longitudinal axis.

In an embodiment the support extends along the first longitudinal axis, wherein the first longitudinal axis can be a middle axis or central axis of the support, e.g. a rod-shaped or tube-shaped support.

The contact unit is configured to take a contact position in which it abuts against a counter-contact unit of the holder of the measurement apparatus. In the contact position a rotational degree of freedom remains in a circumferential direction around the first longitudinal axis between the mounting device and the holder or between the contact unit and the counter-contact unit. The probe unit is therefore rotatable around the first longitudinal axis relative to the holder.

Preferably up to three translational and up to two rotational degrees of freedom are eliminated in the contact position by means of the contact unit and the counter-contact unit, so that particularly exclusively the rotational degree of freedom around the first longitudinal axis remains, if the contact unit is in the contact position with the counter-contact unit.

The mounting device has at least one mounting magnet that comprises at least one magnetic pole at the face. It is advantageous, if multiple mounting magnets are present. The at least one mounting magnet is configured to cooperate with at least one holding magnet of the holder at least in the contact position and in the proximity of the contact position. The at least one holding magnet preferably comprises at least one magnetic pole at the face of the holder. Due to the cooperation of the magnets, an axial force parallel to the first longitudinal axis and in addition a magnetic circumferential force in a circumferential direction around the first longitudinal axis is produced between the mounting device and the holder. The magnetic circumferential force urges the mounting device in a desired rotational position in circumferential direction around the first longitudinal axis relative to the holder. Outside the desired rotational position the magnetic circumferential force has a dimension so that dynamic and static friction between the contact unit and the counter-contact unit are overcome, so that the mounting device takes a desired rotational position relative to the holder in circumferential direction.

The desired rotational position can be defined by means of the mounting and the holding magnets and/or a stop surface of the mounting device in cooperation with a counter-stop surface of the holder. It is advantageous, if the stop surface of the mounting device abuts against a counter-stop surface of the holder, if the mounting device takes the desired rotational position relative to the holder in circumferential direction around the first longitudinal axis.

Therefore, the connection between the probe unit and the holder is simply established in that the contact unit is brought into contact with a counter-contact unit. The holding force is produced magnetically and holds the probe unit in axial direction parallel to the first longitudinal axis in contact with the holder. The contact position is maintained by means of the magnetic axial force. In addition, a magnetic circumferential force is provided in order to eliminate the remaining rotational degree of freedom in circumferential direction and to bring the mounting device into the desired rotational position relative to the holder.

The connection can be released again very simply by overcoming the magnetic force. The establishment and the release of the connection can be carried out without tools.

The establishment and release of the connection can be carried out manually by an operator. In addition, also an automatic establishment and release of a connection between the mounting device and the holder is possible, e.g. by means of a manipulator, such as a gripping device, a robot, etc. In doing so, also an automatic exchange of a probe unit in the holder of the measurement apparatus is possible.

It is advantageous, if the at least one mounting magnet and/or the at least one holding magnet is a permanent magnet. Preferably the at least one mounting magnet and/or the at least one holding magnet is exclusively magnetized axially, i.e. its magnet axis extends preferably substantially parallel to the first longitudinal axis. Alternatively to this, the at least one mounting magnet and/or the at least one holding magnet can be magnetized axially and radially or exclusively radially. In all embodiments each mounting magnet and/or each holding magnet can comprise exactly one or multiple north poles and south poles.

It is advantageous, if the contact unit is provided at a tapering end of the support. This tapering end of the support can be limited by means of a virtual truncated cone shell surface, within which the contact with the counter-contact unit is established in the contact position, whereby no part of the contact unit extends through the virtual truncated cone shell surface.

In a preferred embodiment the mounting device has multiple mounting magnets. The mounting magnets are regularly distributed in circumferential direction around the first longitudinal axis. The magnet axes are preferably orientated parallel to one another and parallel to the first longitudinal axis. The magnet axes can also be obliquely inclined with regard to the first longitudinal axis alternatively, whereby the magnet axes of the mounting magnets then preferably intersect in one common point on the first longitudinal axis.

If multiple mounting magnets are present, it can be advantageous to select the polarity of at least two of the present mounting magnets with view in parallel to the first longitudinal axis in opposed manner. The magnetization direction parallel to the first longitudinal axis of these mounting magnets is therefore opposite or anti-parallel. In doing so, it is possible that the mounting magnets and the assigned holding magnets repel each other, if the mounting device and the holder take a rotational position in circumferential direction that is far away from the desired rotational position and the magnetic axial force only effects an attraction, if the mounting device and the holder are in a relative position in circumferential direction that is sufficiently close to the desired rotational position. This aspect of the invention can also be realized independent from all other features of the probe unit.

As explained, the contact unit comprises a contact surface. The contact surface can be continuous in circumferential direction. In a preferred embodiment the contact surface is divided into multiple surface sections separated from one another and arranged with distance to one another in circumferential direction. The contact surface is rotationally symmetrical in circumferential direction and particularly corresponds to a truncated cone shell surface or at least sections thereof. In case of a division of the contact surface in surface sections, they are arranged on a common virtual truncated cone shell surface around the first longitudinal axis and preferably regularly distributed in circumferential direction.

It is preferred that all of the surface sections have the same surface area and/or the same shape.

In a particularly advantageous embodiment the optionally present stop surface can be arranged in circumferential direction between two adjacent surface sections. In this embodiment a particularly compact configuration of the mounting device results.

The stop surface can be orientated parallel to the axial direction and/or substantially orthogonal to the circumferential direction.

Preferably the at least one mounting magnet of the mounting device is arranged closer to the first longitudinal axis than the contact unit or the contact surface of the contact unit. Thus, the contact surface can surround the mounting magnets in circumferential direction.

The invention also refers to a holder of the measurement apparatus that is configured for attaching a probe unit on the measurement apparatus. The holder comprises a holding body on which the counter-contact unit is present. The holding body can be rod or tube-shaped. The counter-contact unit defines a second longitudinal axis. The counter-contact unit has preferably a counter-contact surface on a counter-contact body that is continuous in circumferential direction around the second longitudinal axis and therefore closed in a ring-shaped or tube-shaped manner. For example, the counter-contact surface can be a truncated cone shell surface.

The counter-contact unit is configured to abut against a contact unit of a mounting device, if the mounting device is in a contact position relative to the holder. In the contact position one rotational degree of freedom around the longitudinal axis remains between the mounting device and the holder.

The contact unit and the counter-contact unit are particularly configured so that the first longitudinal axis of the contact unit and the second longitudinal axis of the counter-contact unit are orientated along a common straight line in the contact position and thus form a common longitudinal axis.

A direction parallel to one of the longitudinal axes is denoted as axial direction. A rotational direction around one of the longitudinal axes is denoted as circumferential direction.

The holder comprises at least one holding magnet that cooperates with the at least one mounting magnet of the mounting device, at least in the contact position or in the proximity of the contact position. Due to the cooperation of the at least one holding magnet and the at least one mounting magnet in the contact position, a magnetic axial force parallel to the second longitudinal axis as well as a magnetic circumferential force in circumferential direction around the second longitudinal axis is produced. Due to the magnetic axial force, the mounting device is held in the contact position on the holder. Due to the magnetic circumferential force, a friction force between the contact unit and the counter-contact unit can be overcome in order to adjust a desired rotational position between the mounting device and the holder.

It is preferred, if the number of holding magnets corresponds to the number of mounting magnets. Each of the holding magnets forms together with the respectively assigned mounting magnet one magnet pair. The holding magnet and the mounting magnet of a common magnet pair are magnetized in opposite direction relative to one another so that the south pole of the holding magnet faces the north pole of the mounting magnet or vice versa.

It is preferred, if the at least one holding magnet is magnetized axially, i.e. its magnet axis is substantially orientated parallel to the second longitudinal axis. If multiple holding magnets are present, they are preferably regularly distributed in circumferential direction around the longitudinal axis. The magnet axes of the mounting magnets are orientated parallel to one another or can alternatively intersect in a common point on the second longitudinal axis.

It is preferred, if two of the provided holding magnets are polarized opposite one another with view in axial direction, i.e. comprise opposite magnetization directions. This aspect of the invention can also be realized independent from all other aspects of the holder.

The counter-contact unit can be formed by means of a tube-shaped counter-contact body of the holder. The counter-contact surface is preferably located inside the tube-shaped counter-contact body. The counter-contact body can be a monolithic part of the holding body.

Preferably the contact unit or the contact surface consists of a material having a higher elasticity than the material of the counter-contact unit or the counter-contact surface. The contact unit or the contact surface can consist of plastic. The counter-contact unit or counter-contact surface can consist of a metallic material, particularly a steel alloy. In doing so, manufacturing of the contact unit and the counter-contact unit is possible with larger manufacturing tolerances as in the case of a material pair of materials having equal elasticities.

In a modified embodiment it is also possible that the contact unit or the contact surface on one hand and the counter-contact unit or counter-contact surface on the other hand consist of the same material respectively, e.g. a steel alloy.

A further aspect of the present invention refers to an arrangement comprising a probe unit and a holder. Preferably the probe unit and the holder can be configured corresponding to any of the above embodiments.

In this aspect of the arrangement the probe unit comprises a support, a probe element arranged on the support as well as a mounting device present on the support. The mounting device is configured to be connected with the holder of the measurement apparatus. The mounting device comprises a contact unit defining a first longitudinal axis. In addition, the mounting device comprises at least one mounting magnet.

The holder of the arrangement has a holding body having a counter-contact unit defining a second longitudinal axis. The holder comprises in addition at least one holding magnet.

The at least one mounting magnet and the at least one holding magnet cooperate. In doing so, a magnetic repulsion is effected, if the probe unit and the holder of the arrangement are arranged in a relative rotational position around the first longitudinal axis and the second longitudinal axis that is within a first rotational position range. An attracting force between the at least one mounting magnet and the at least one holding magnet is effected, if the relative rotational position of the probe unit and the holder is within a second rotational position range that is different from the first rotational position. The second rotational position range corresponds to or comprises the desired rotational position of the probe unit and holder in circumferential direction around the longitudinal axes. An attraction is, therefore, only effected, if the relative rotational position between the probe unit and the holder is sufficiently well corresponding to the desired rotational position. By means of this aspect of the invention, the mechanical connection between the probe unit and holder with one another is simplified and a wrong orientation of the probe unit relative to the holder is avoided.

In another independent aspect of this invention the above-described interface of the probe unit for connection with the holder can also be used as interface for other bodies, e.g. an object carrier with an object arranged thereon, for an object holder (e.g. chuck) for an object to be measured, for a support tip or another bearing or support element, by means of which particularly an object to be measured can be supported, etc.

The mounting device configured to be mechanically connected with a holder can then be present on this body. The mounting device of the body can correspond to any of the embodiments that have been described above in connection with the probe unit. The holder can correspond to any of the above embodiments.

The mounting device comprises the contact unit defining the first longitudinal axis. The contact unit is configured to contact the counter-contact unit of the holder in the contact position so that a rotational degree of freedom in a circumferential direction around the first longitudinal axis remains between the mounting device and the holder. The mounting device comprises at least one mounting magnet that is configured to cooperate with respectively one holding magnet of the holder in the contact position so that a magnetic axial force parallel to the first longitudinal axis is created between the mounting device and the holder and that a magnetic circumferential force in circumferential direction around the first longitudinal axis is created between the mounting device and the holder until a predefined desired rotational position around the longitudinal axis is reached between the mounting device and the holder.

BRIEF DESCRIPTION OF THE DRAWINGS

Advantageous embodiments of the invention are derived from the dependent claims, the description and the drawings. In the following preferred embodiments are described in detail based on the attached drawing. The drawings show:

DETAILED DESCRIPTION OF THE DRAWINGS

Figure 1:
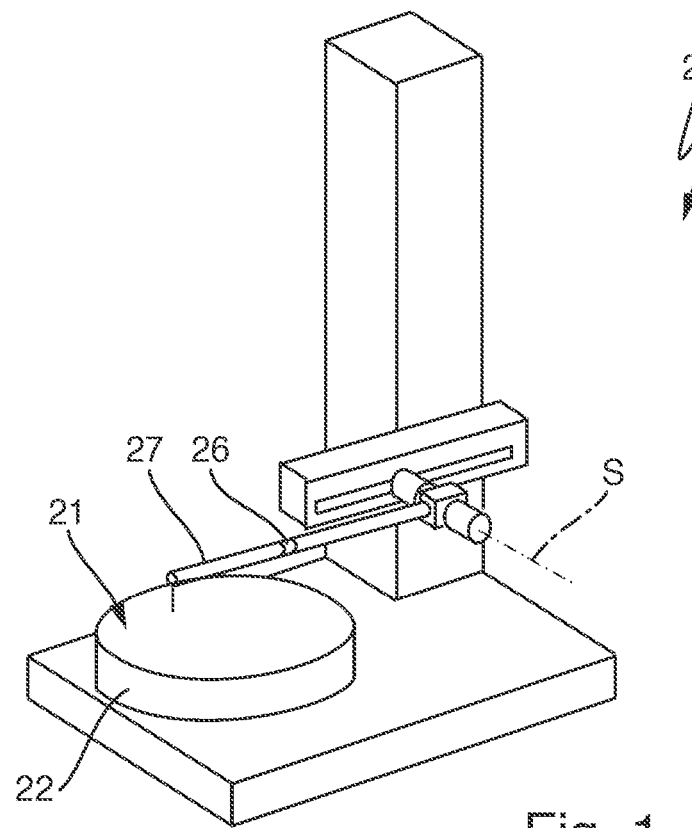
FIG. 1 a perspective illustration of an embodiment of a measurement apparatus, FIG. 2 a schematic illustration of a holder of the measurement apparatus as well as a probe unit connected with the holder, FIG. 3 a perspective illustration of an embodiment of a mounting device that is arranged in an embodiment of a holder, FIG. 4 a longitudinal section along a common longitudinal axis through the mounting device and the holder of FIG. 3, FIG. 5 a perspective illustration of an embodiment of a mounting device, FIG. 6 a perspective illustration of an embodiment of a holder, FIG. 7 a schematic top view on the mounting device of FIG. 5 with view in axial direction parallel to the first longitudinal axis, FIG. 8 a schematic top view on the holder of FIG. 6 with view in axial direction parallel to a second longitudinal axis, FIGS. 9-12 a schematic principal illustration in each case of the relative arrangement of mounting magnets of the mounting device and holding magnets of the holder in an abutment position between the mounting device and the holder during establishment of a desired rotational position in circumferential direction and around the common longitudinal axis, FIG. 13 an arrangement of an object carrier with an object, whereby the object carrier is arranged by means of a mounting device on a holder, and FIG. 14 an arrangement of a support element for an object, whereby the support element is arranged on a holder by means of a mounting device.

In FIG. 1 an embodiment of a measurement apparatus 20 is illustrated. The measurement apparatus 20 is configured to detect or determine a measurement value at a measurement location on an object surface 21 of an object 22. For example, a surface contour, a roughness or the like can be determined by means of the measurement apparatus 20.

For measurement value detection the measurement apparatus 20 comprises a holder 26. The holder 26 serves to releasably attach a probe unit 27. For example, holder 26 can be pivotably supported around a pivot axis S. The measurement apparatus 20 can be configured to apply a torque around the pivot axis S on holder 26 and a probe unit 27 held therein and/or in order to detect a deflection of holder 26 or probe unit 27 arranged therein around the pivot axis S and to determine the measurement value therefrom. In addition or as an alternative, holder 26 and the probe unit 27 held therein can be positioned around the pivot axis S in order to adjust a distance between the probe unit 27 and the object surface 21.

The probe unit 27 can operate in a contacting or tactile manner or also in a contactless manner.

The probe unit 27 comprises a support 28. The support 28 has a probe element 29 at one end that is configured for contact with the object surface 21 according to the embodiment. In this embodiment probe unit 27 operates in a tactile manner. The probe element 29 can have a defined geometry at its end assigned to the object surface 21, e.g. a tip, a ball or the like.

In modification thereto probe element 29 can also operate contactless and can, for example emit light onto the object surface 21 and receive light reflected therefrom.

The probe element 29 can be optionally attached on the support 28 in exchangeable manner, e.g. by means of a force-fit and/or form-fit connection. For example, in an embodiment a clamping screw 30 can be provided on the support 28 in order to apply the probe element 29 with a clamping force and to hold it on the support 28. In another embodiment probe element 29 can also be unreleasably attached to the support 28, particularly in case of a probe element 29 with very small dimensions.

At an end of support 28 of probe unit 27 opposite the probe element 29, a mounting device 31 is provided. A mounting device 31 is configured to establish a releasable connection with the holder 26. Details of the mounting device 31 are derived particularly from FIGS. 4, 5 and 7.

The mounting device 31 comprises a contact unit 32. The contact unit 32 defines a first longitudinal axis L1. In the embodiment contact unit 32 is realized by a contact body 33 that tapers towards its free end. The contact body 33 can at least be partly truncated cone-shaped.

In the following description, in addition to the first longitudinal axis L1, also a second longitudinal axis L2 and a common longitudinal axis L are mentioned. A direction parallel to one of these longitudinal axes is denoted as (respective) axial direction A. A rotary direction around one of these longitudinal axes is denoted as (respective) circumferential direction U.

The contact unit 32 comprises a contact surface 34 that at least partly surrounds the first longitudinal axis L1 in circumferential direction U. The contact surface 34 can be continuous in circumferential direction U. In the preferred embodiment illustrated here the contact surface 34 is divided into multiple separate surface sections 34a that are arranged with distance to one another in circumferential direction U. Preferably the surface sections 34a are identically configured. In the embodiment the surface sections 34a are respectively formed by one section or area of a truncated cone shell surface, which extends along a limited angle area in circumferential direction. According to the example, this angle area is less than 120° and preferably less than 60° or less than 30° or less than 20°. According to the example, the angle area is less than 10°. The surface sections 34a are preferably regularly distributed in circumferential direction around the first longitudinal axis L1.

Adjacent to the surface sections 34a the contact body 33 comprises—compared with a truncated cone, the shell surface of which contains the surface sections 34a—cavities or depressions that are formed by means of flattenings 35 on the contact body 33 in the embodiment. Respectively one or multiple of such flattenings 35 can be provided between two surface sections 34a of the contact surface 34 that are adjacent to one another in circumferential direction U. In the embodiment each flattening is realized by one flat area that extends in axial direction A. Due to these flattenings 35 or cavities, the contact body 33 is reduced relative to truncated cone-shaped contact body having a contact surface 34 that is formed by a virtual truncated cone shell surface. Outside of the surface sections 34a of contact surface 34 the contact body 33 has a smaller distance to the first longitudinal axis L1 at the flattenings 35 or cavities than the virtual truncated cone shell surface 36.

In the embodiment illustrated here flattenings 35 are planar surfaces that extend parallel to the axial direction A.

The entire area content of all surface sections 34a together is preferably remarkably less than the area content of the virtual truncated cone shell surface 36. Preferably the total area content of all surface sections 34a is less than 50%, less than 25%, less than 10% or less than 5% of the area content of the virtual truncated cone shell surface 36.

In modification to the illustrated embodiment the contact surface 34 can also be continuous in circumferential direction U, e.g. a surface corresponding to the virtual truncated cone shell surface 36. Due to the cavities or flattenings 35 and reduction of the contact surface 34 down to multiple surface sections 34a, configured for abutment with a respective counter-contact surface, the static and dynamic friction between the contact surface 34 and the assigned counter-contact surface can be reduced.

Preferably the contact surface 34 comprises exactly three or at least three separate surface sections 34a.

In modification to the illustrated embodiment, the cavities or flattenings 35 at the contact body 33 can also be configured in a different manner in order to reduce the total area content of the contact surface 34 or the surface sections 34a respectively. Thereby the surface sections 34a can be completely separated from one another or can be connected at least in sections.

Figure 7:
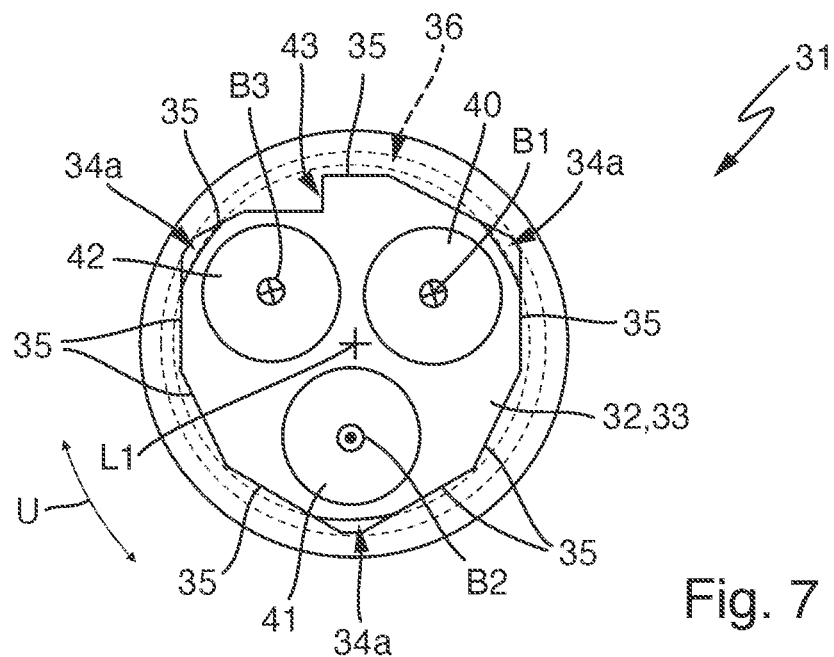

The mounting device has in addition at least one and preferably multiple mounting magnets, according to the example a first mounting magnet 40, a second mounting magnet 41 and a third mounting magnet 42. The first mounting magnet 40 has a first magnet axis B1, the second mounting magnet 41 has a second magnet axis B2 and the third mounting magnet 42 has a third magnet axis B3 (FIG. 7). The magnet axes B1, B2, B3 are orientated parallel to the axial direction A in the embodiment. Alternative thereto the magnet axes B1, B2, B3 could also intersect in a common point on the first longitudinal axis L1.

The mounting magnets 40, 41, 42 are magnetized in axial direction A according to the example, so that their magnet field lines exit or enter in axial direction A at the axial end surfaces. The north pole and the south pole of each mounting magnet 40, 41, 42 are located next to each other in direction of the respective magnet axis B1, B2, B3.

In the embodiment two of the provided mounting magnets have opposite magnetizations or magnetic polarizations respectively, so that their magnetization directions are antiparallel to one another. In the embodiment the second mounting magnet 41 has a magnetic polarization that is opposed compared with the first mounting magnet 40 and the third mounting magnet 42. The different magnetization is illustrated by the symbol of the magnet axes that is illustrated by means of a cross on one hand and by means of a dot inside a circle on the other hand. The mounting magnets having identical symbols for the magnet axes have the same magnetization direction.

The mounting magnets 40, 41, 42 are arranged inside the contact body 33 according to the example. They are arranged closer to the first longitudinal axis L1 than the surface sections 34a of the contact surface 34.

The mounting device 31 has in addition a stop surface 43 in the embodiment illustrated here. The stop surface 43 is preferably realized on the contact body 33. It can be present between two surface sections 34a on the contact body 33 that are adjacent in circumferential direction. The stop surface 43 can be formed by a planar surface. In the embodiment stop surface 43 is substantially orientated orthogonal to the circumferential direction U. As particularly apparent from FIG. 7, stop surface 43 is orientated parallel to the axial direction A in the illustrated embodiment.

The end side face 44 of the contact body 33 is orientated orthogonal to the first longitudinal axis L1 in the embodiment. The mounting magnets 40, 41, 42 are offset relative to the face 44 and particularly do not project beyond the face 44.

Figure 2:
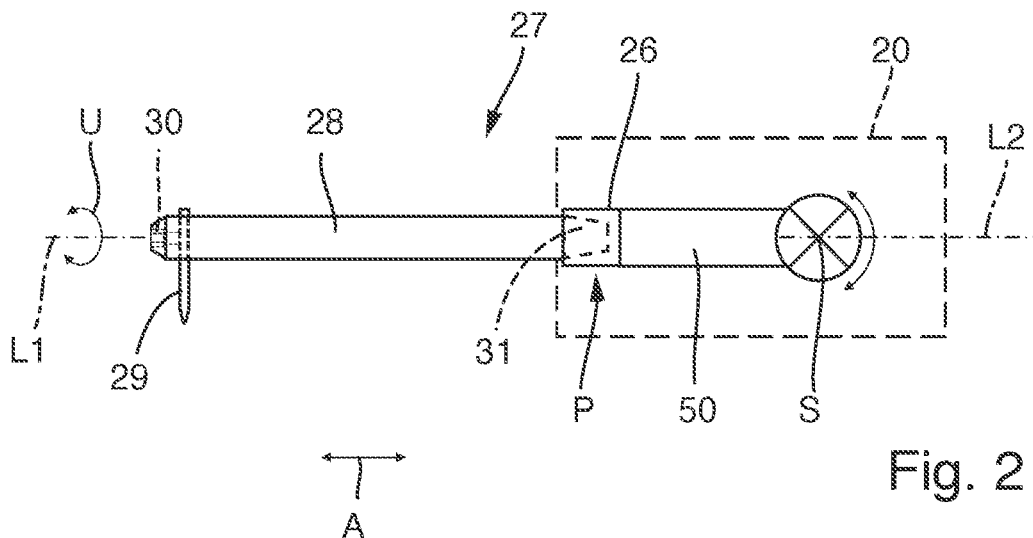
Figure 3:
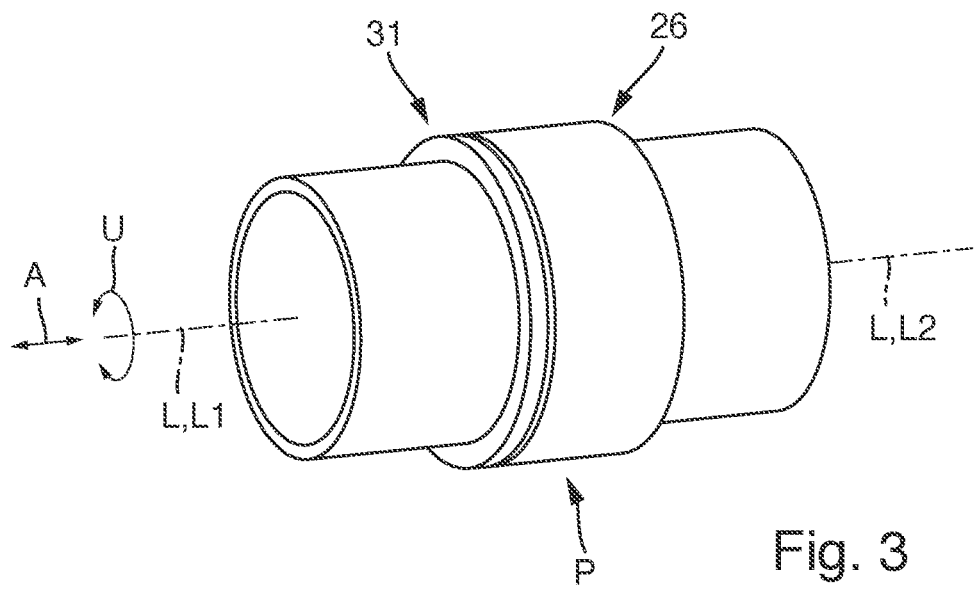
Figure 4:
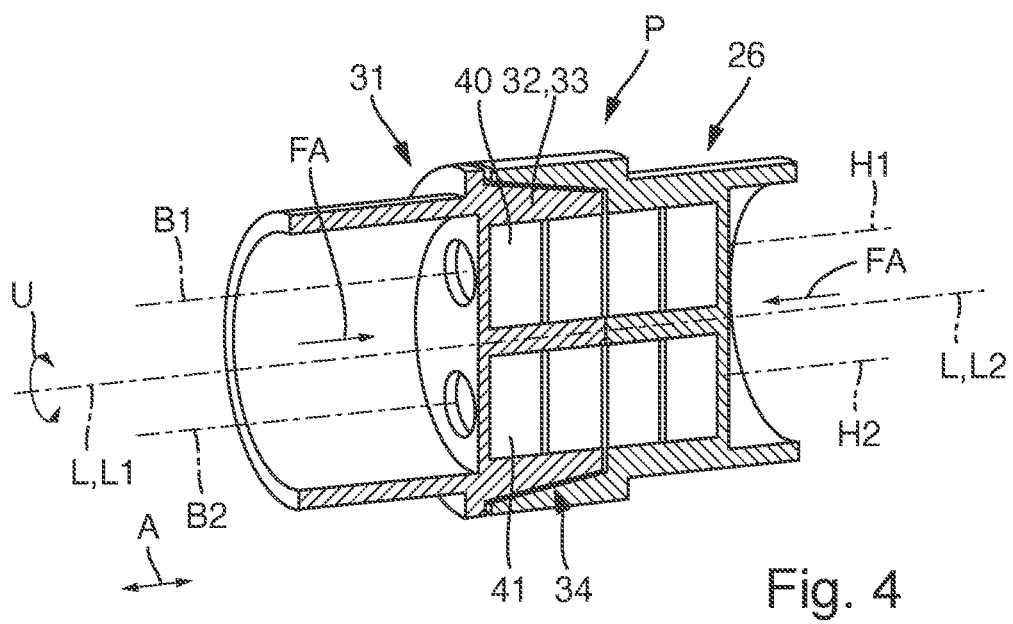
Figure 5:
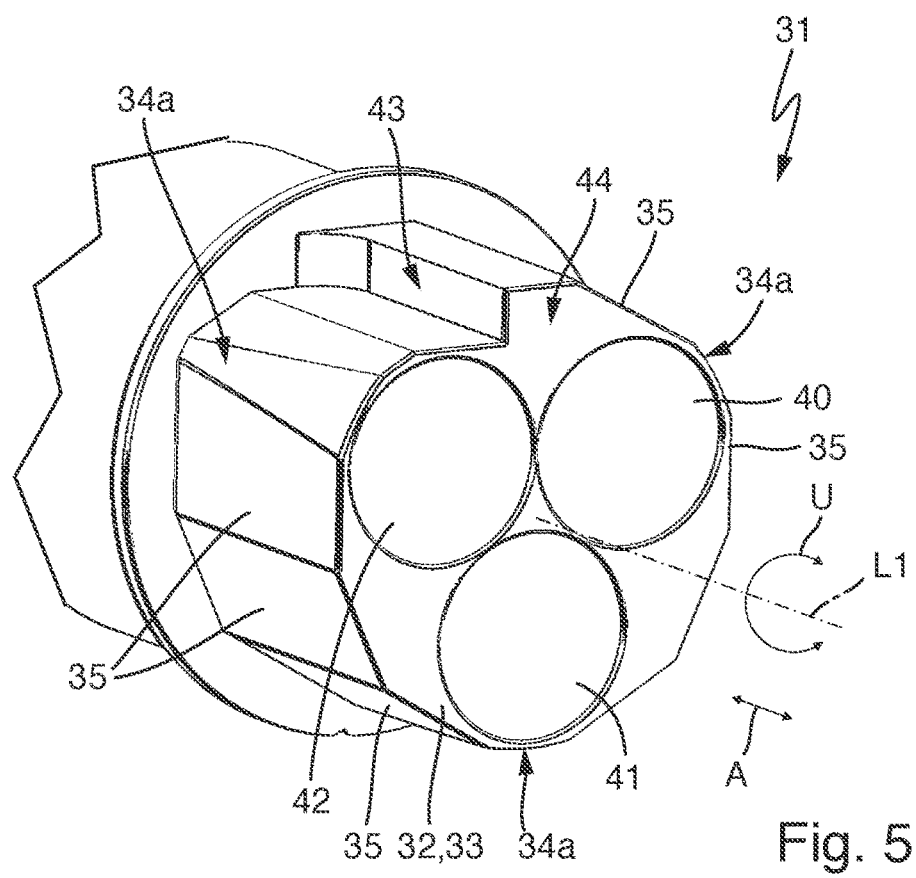
Figure 6:
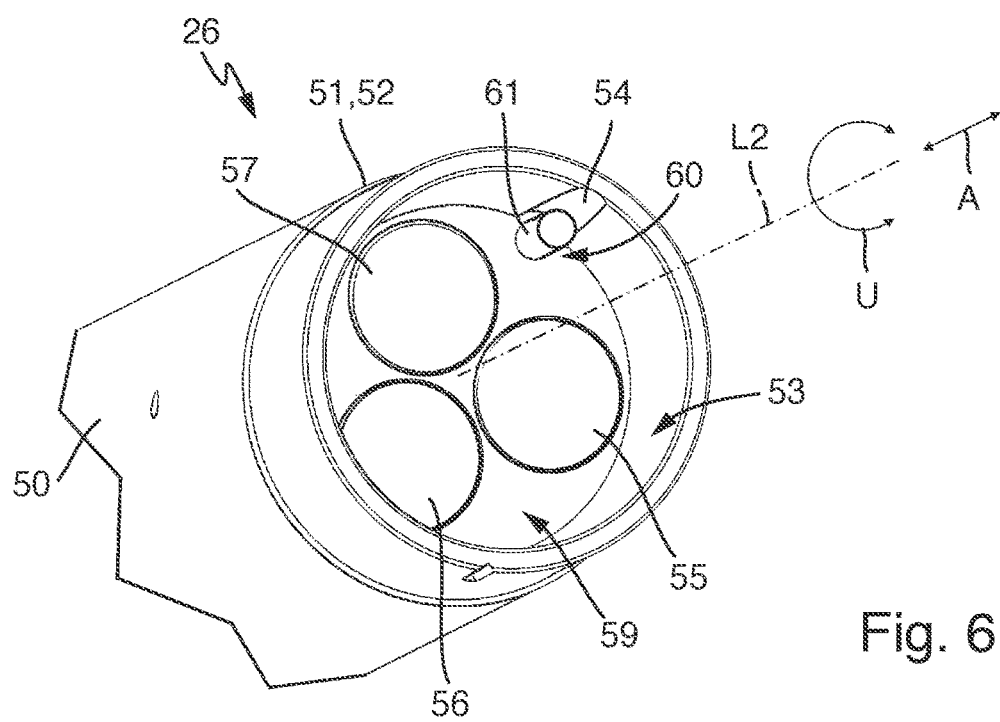
Figure 8:
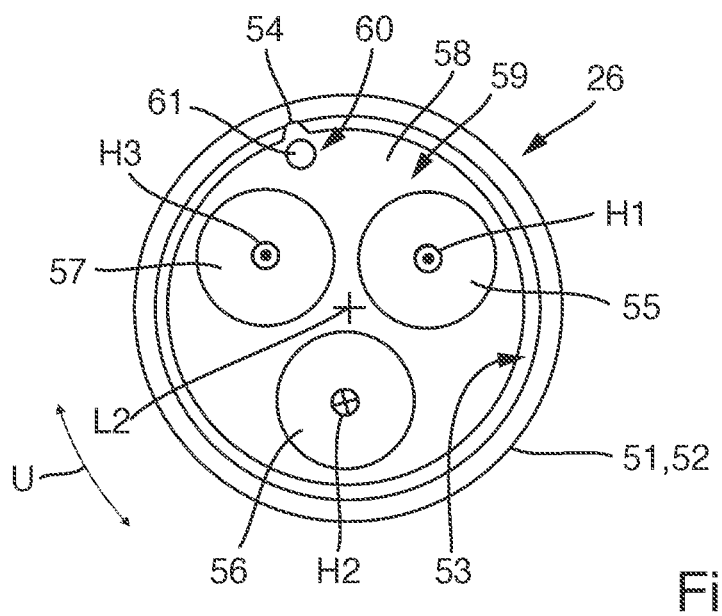

The configuration of the holder 26 is particularly apparent from FIGS. 4, 6 and 8. The holder 26 defines a second longitudinal axis L2 that coincides with the first longitudinal axis L1 defined by the mounting device 31 and thus forms a common longitudinal axis L defined by the mounting device 31 when the connection with the mounting device 31 is established (FIGS. 2-4).

The holder 26 has a holding body 50 having a counter-contact unit 51. The counter-contact unit 51 is realized by a counter-contact body 52 according to the example. The counter-contact body 52 can be a monolithic part of holding body 50. For example, one end of the holding body 50 can form the counter-contact body 52.

The counter-contact body 52 can be a body that is continuously tube-shaped in circumferential direction U and is preferably not slotted or otherwise interrupted. The counter-contact body 52 is configured as hollow body and coaxially surrounds the second longitudinal axis L2. At its inner side facing the second longitudinal axis L2 counter-contact body 52 has a counter-contact surface 53. In the embodiment, apart from a gutter-shaped depression 54, counter-contact surface 53 is free of cavities and extends outside the gutter-shaped depression 54 along the truncated cone shell surface.

The half opening angle of the virtual truncated cone shell surface 36 and the truncated cone shell surface of counter-contact surface 53 relative to second longitudinal axis L2 is preferably equal and particularly smaller than 10° or smaller than 5°. The truncated cone shell surface of counter-contact surface 53 and the virtual truncated cone shell surface 36 of mounting device 31 are identical according to the example.

In a contact position P of mounting device 31 the surface sections 34a of the contact surface 34 abut two-dimensionally or at least in a line-shaped manner inside a radial plane containing the first longitudinal axis L1 against the counter-contact surface 53. A rotational degree of freedom in circumferential direction U around the common longitudinal axis L remains due to the contact surface 34 or their surface sections 34a and the counter-contact surface 53. This rotational degree of freedom is realized in the embodiment in that counter-contact surface 53 is rotationally symmetrical with reference to the second longitudinal axis L2 and the surface sections 34a are arranged in a rotationally symmetrical manner with reference to the first longitudinal axis L1 (the surface sections 34a are arranged inside the virtual truncated cone shell surface 36 around the first longitudinal axis L1).

The other rotational degrees of freedom around the axes orthogonal to the common longitudinal axis L as well as the translational degrees of freedom in axial direction A and orthogonal to the common longitudinal axis L are eliminated in the contact position P by means of the contact unit 32 or the counter-contact unit 51.

The holder 26 comprises in addition at least one holding magnet, wherein the number of holding magnets corresponds preferably to the number of mounting magnets of the mounting device 31. Thus, the holder 26 comprises in the preferred embodiment illustrated here a first holding magnet 55, a second holding magnet 56 and a third holding magnet 57. Analog to the mounting magnets 40, 41, 42 holding magnets 55, 56, 57 are magnetized in axial direction A, so that north pole and south pole of each holding magnet 55, 56, 57 are arranged adjacent in axial direction A. First holding magnet 55 has a first magnet axis H1, second holding magnet 56 has a second magnet axis H2 and third holding magnet 57 has a third magnet axis H3 (FIG. 8). The magnet axes H1, H2, H3 are orientated in axial direction A in the embodiment. Alternative thereto the magnet axes H1, H2, H3 of holding magnets 55, 56, 57 could also intersect in a common point on the second longitudinal axis L2.

The counter-contact body 52 configured as hollow body or tube according to the embodiment surrounds an interior region 58. This interior region 58 could also be denoted as insertion space. Preferably the holding magnets 55, 56, 57 do not or only insignificantly project into the interior region 58. In axial direction A interior region 58 is limited by means of an axial surface 59 on the counter-contact body 52. In the embodiment axial surface 59 is orientated orthogonal to the second longitudinal axis L2. Preferably the holding magnets 55, 56, 57 are offset relative to the axial surface 59 and do not project beyond the axial surface 59 into the interior region 58.

Each holding magnet 55, 56, 57 forms together with an assigned mounting magnet 40, 41, 42 one magnet pair respectively. With the connection between the mounting device 31 and the holder 26 established, these magnet pairs create a magnetic axial force, by means of which mounting magnets 40, 41, 42 and the holding magnets 55, 56, 57 attract in axial direction A. Thereby the mounting device 31 is held in the contact position P on the holder 26 and the surface sections 34a of contact surface 34 remain in contact with counter-contact surface 53.

In the contact position P a desired rotational position R in circumferential direction U is defined by means of the stop surface 43 of mounting device 31 and a counter-stop surface 60 of holder 26. In the embodiment the counter-stop surface 60 is arranged on a counter-stop 61. Counter-stop 61 is arranged in the interior region 58. In the embodiment counter-stop 61 is pin-shaped, e.g. cylindrically. Counter-stop surface 60 is formed by the outer surface or shell surface of counter-stop 61 or at least a section thereof.

Figure 9:
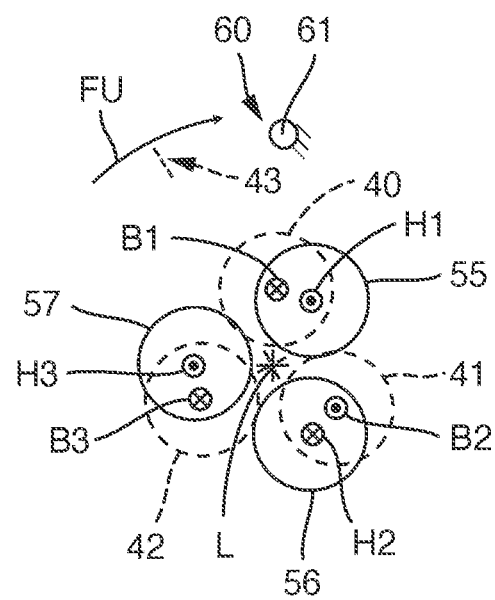
Figure 10:
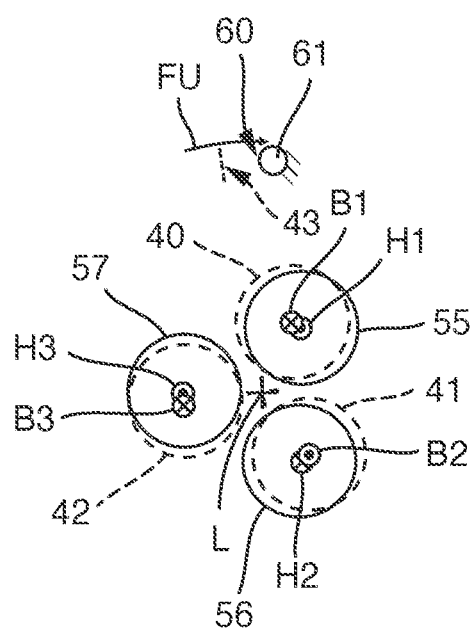
Figure 11:
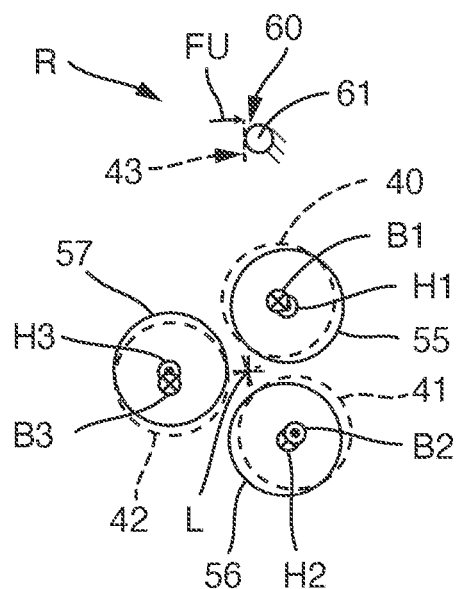

Based on the schematic principle illustration of FIGS. 9-11, the establishment of the releasable connection between mounting device 31 and holder 26 is explained.

For example, probe unit 27 can be held in the hand at support 28 and can be approximately aligned with its first longitudinal axis L1 relative to the second longitudinal axis L2 of holder 26. Subsequently, mounting device 31 is approached to holder 26 and contact body 32 is inserted into interior region 58.

Assumed that the present rotational position between mounting device 31 and holder 26 deviates remarkably (e.g. about 120° or more) from the desired rotational position R (first rotational position range), mounting magnets and holding magnets repel at least partly, so that a connection being correct in terms of measurement technology and/or a stable connection cannot be readily established. Only when the rotational position between mounting device 31 and holder 26 corresponds substantially (second rotational position range), an attracting magnetic axial force FA is created by all of the magnets 40, 41, 42, 55, 56, 57, so that the mounting device takes a contact position P in which surface sections 34a of contact surface 34 abut against counter-contact surface 53. This aspect of the invention can also be realized independent from all other features of the probe unit 27 and the holder 26, particularly independent from whether a circumferential force FU is also produced by means of the provided mounting magnets 40, 41, 42 and/or holding magnets 55, 56, 57.

In the embodiment contact position P is exclusively defined by means of surface sections 34a and counter-contact surface 53. Particularly the mounting magnets 40, 41, 42 are not in direct contact with holding magnets 55, 56, 57 and in the embodiment also the face 44 and the axial surface 59 are arranged with distance to one another. A contact between the mounting device 31 and the holder 26 is only provided in the contact position P outside the desired rotational position R exclusively by means of surface sections 34a and counter-contact surface 53.

As illustrated in FIG. 9, the magnet axes B1, B2, B3 of mounting magnets 40, 41, 42 are offset in circumferential direction U with regard to the magnet axes H1, H2, H3 of holding magnets 55, 56, 57, so that in addition to the magnetic axial force FA a magnetic circumferential force FU or a magnetic torque in circumferential direction U is produced. The magnetic torque or the magnetic circumferential force FU is directed so that stop surface 43 and counter-stop surface 60 are urged toward one another, so that the mounting device 31 is urged into its desired rotational position R relative to the holder 26.

In modification to the illustrated embodiment it is sufficient, if only one or at least not all of the magnet axes B1, B2, B3 of mounting magnets 40, 41, 42 are offset in circumferential direction relative to the respectively assigned magnet axis H1, H2, H3 of the assigned holding magnets 55, 56, 57 in order to produce the circumferential force FU or the magnetic torque in circumferential direction U.

Figure 12:
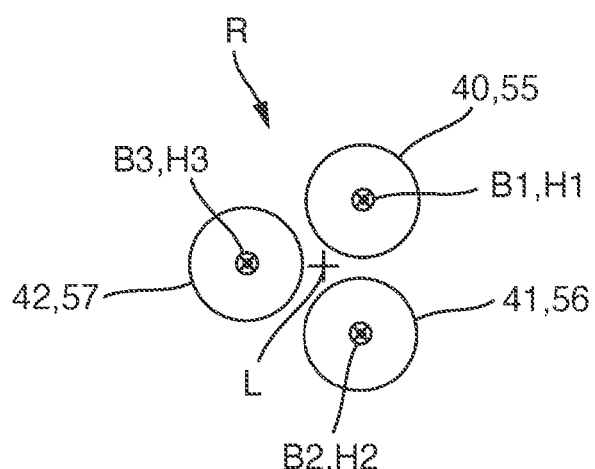

Due to the material pair of the smaller two-dimensional or line-shaped contact between surface sections 34a and counter-contact surface 53, the static and dynamic friction outside of the desired rotational position R is sufficiently small, so that due to the magnetic circumferential force FU, a rotational movement between mounting device 31 and holder 26 into the desired rotational position R is effected. In doing so, stop surface 43 and counter-stop surface 60 approach one another. During this approach also the magnet axes B1, B2, B3 of mounting magnets 40, 41, 42 approach the respectively assigned magnet axis H1, H2, H3 of the assigned holding magnet 55, 56, 57, whereby the amount of the magnetic torque or the magnetic circumferential force FU decreases (FIG. 10). If finally the desired rotational position R is reached, stop surface 43 abuts against counter-stop surface 60 (FIGS. 11 and 12).

In the desired rotational position R preferably an offset still exists between magnet axes B1, B2, B3 of mounting magnets 40, 41, 42 and magnet axes H1, H2, H3 of holding magnets 55, 56, 57, so that also a magnetic torque or a magnetic circumferential force FU is maintained when reaching the desired rotational position R and urges stop surface 43 against counter-stop surface 60 (FIG. 11). In modification to this, the magnetic circumferential force FU could also be equal to zero when reaching the desired rotational position R. In this case, stop surface 43 and counter-stop surface 60 could also be omitted and the desired rotational position R can be defined by means of the magnet axes of mounting magnets 40, 41, 42 and holding magnets 55, 56, 57, as schematically illustrated in FIG. 12.

For releasing the established connection, a relative rotation between mounting device 31 and holder 26 can be carried out so that stop surface 43 moves away from counter-stop surface 60. If a sufficiently large relative rotation is carried out, mounting magnets 40, 41, 42 and holding magnets 55, 56, 57 repel in axial direction A, because not all of the mounting magnets 40, 41, 42 and not all of the holding magnets 55, 56, 57 comprise the same magnetic polarization. As far as two north pole and/or two south poles approach one another, due to this relative rotation or are arranged opposite one another in axial direction A, a repulsion between mounting device 31 and holder 26 occurs or the remaining attraction force in axial direction A is reduced in a manner that probe unit 27 can be removed from holder 26 in that it is pulled out of the interior region 58 in axial direction.

In this manner a manual or automatic exchange of probe unit 27 can be carried out very simply. The forces applied thereby onto holder 26 and thus onto measurement apparatus 20 are very low, so that an excessive stress of mechanical and/or electrical and/or electronical and/or optical components of measurement apparatus 20 are avoided. The probe unit 27 can be inserted and removed without using a tool.

Figure 13:
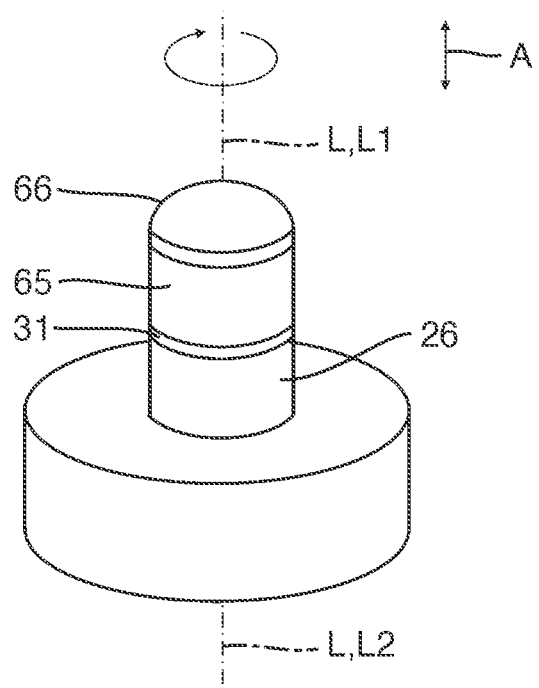
Figure 14:
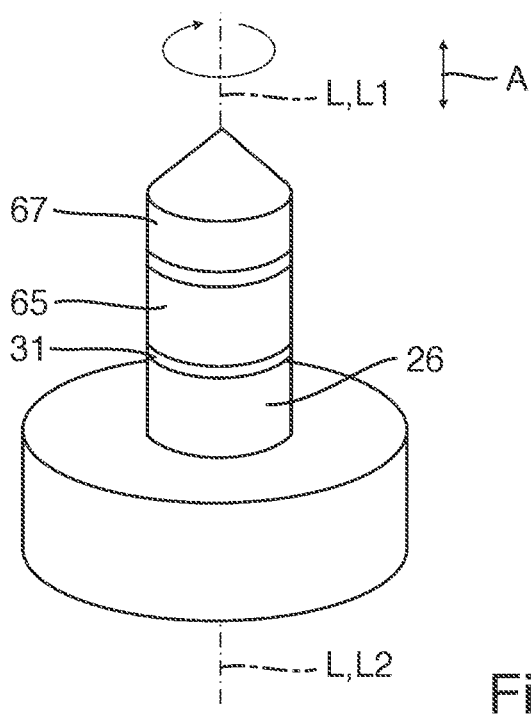

The interface between probe unit 27 and holder 26 described above cannot only be used for a probe unit, but also for other bodies, e.g. for object holders such as object carriers, chucks, bearing or support elements, etc. Examples for this are schematically illustrated in FIGS. 13 and 14. In the embodiments according to FIGS. 13 and 14, holder 26 can also be configured as described above. Instead of the support 28, a holding body 65 can be arranged on the holder 26. The holding body 65, therefore, comprises the mounting device 31 corresponding to one of the above described embodiments.

In the embodiment according to FIG. 13, an object 66 is connected with the object holder. For example, the object 66 can be an object 66 to be measured. For example, object 66 can be a lens. By means of suitable means or devices, object 66 can be releasably arranged on holding body 65. For example, holding body 65 can comprise clamping means in order to hold object 66 in a force-fit and/or form-fit manner.

Another embodiment is illustrated in FIG. 14 in which a bearing or support element 67 is arranged on the holding body 65. The bearing or support element is configured as support tip in the embodiment. The bearing or support element 67 can be used to support an object 66 to be measured or a holding body 65. In the illustrated embodiment a respective conical depression can be provided on the object 66 or holding body 65 corresponding to the support tip.

In the embodiment according to FIG. 13, a common longitudinal axis L is identical with the symmetric axis of the object 66 to be measured. In the embodiment illustrated in FIG. 14 the common longitudinal axis L corresponds to the longitudinal center axis or symmetric axis of bearing or support element 67.

If a torque can be applied on the object 66 or the bearing or support element 67 in circumferential direction U, it is advantageous, of only one sense of rotation in circumferential direction U is allowed in the direction of which the torque is effected. This sense of rotation should be orientated so that the stop surface 43 of mounting device 31 is urged against counter-stop surface 60 of holder 26. In addition or as an alternative, also other devices can be present in order to support a torque in circumferential direction in one or in both senses of rotation. For example, a locking between holding body 65 and holder 26 can be carried out when reaching the desired rotational position R, so that the locking supports torques in one sense of rotation or in both senses of rotation in circumferential direction U. For releasing holding body 65 the locking can be disengaged.

The invention refers to a probe unit 27 as well as a holder 26 of a measurement apparatus 20 that can be releasably connected and disconnected from one another, particularly without tools. For this purpose probe unit 27 comprises a mounting device 31 having a contact surface 34 and the holder comprises a counter-contact surface 53 assigned to the contact surface 34. The contact surface 34 can be divided into multiple separate surface sections 34a that respectively abut along a line or two-dimensionally against the assigned counter-contact surface, if mounting device 31 takes a contact position P. The holding force is produced by at least one mounting magnet 40, 41, 42 of mounting device 31 and/or at least one holding magnet 55, 56, 57 of holder 26. Thereby a magnetic axial force FA in an axial direction A as well as a magnetic circumferential force FU in circumferential direction U around the axial direction A is created, so that mounting device and holder 26 are urged relative to one another in a desired rotational position R in circumferential direction U.

LIST OF REFERENCE SIGNS

20 Measurement apparatus
21 object surface
22 object
26 holder
27 probe unit
28 support
29 probe element
30 clamping screw 31 mounting device
32 contact unit
33 contact body
34 contact surface
34a surface section of contact surface
35 flattening
36 virtual truncated cone shell surface
40 first mounting magnet
41 second mounting magnet
42 third mounting magnet
43 stop surface
44 face of contact body
50 holding body
51 counter-contact unit
52 counter-contact body
53 counter-contact surface
54 depression
55 first holding magnet
56 second holding magnet
57 third holding magnet
58 interior region
59 axial surface
60 counter-stop surface
61 counter-stop
65 holding body
66 object
67 bearing or support element
A axial direction
B1 magnet axis of first mounting magnet
B2 magnet axis of second mounting magnet
B3 magnet axis of third mounting magnet
FA magnetic axial force
FU magnetic circumferential force
H1 magnet axis of first holding magnet
H2 magnet axis of second holding magnet
H3 magnet axis of third holding magnet
L common longitudinal axis
L1 first longitudinal axis
L2 second longitudinal axis
P contact position
R desired rotational position
S pivot axis
U circumferential direction

The invention claimed is:

1. A probe unit (27) for a measurement apparatus (20) configured to detect a measurement value at a measurement location of an object surface (21) in a contacting or contactless manner, the probe unit (27) comprising:
a support (28),
a probe element (29) arranged on the support (28) that is configured for probing the object surface (21) in a contacting or contactless manner,
a mounting device (31) provided on the support (28) that is configured to be mechanically connected with a holder (26) of the measurement apparatus (20), wherein the mounting device (31) comprises a contact unit (32) that defines a first longitudinal axis (L1) and that is configured to abut against a counter-contact unit (51) of the holder (26) of the measurement apparatus (20) in a contact position (P) so that a rotational degree of freedom in a circumferential direction (U) around the first longitudinal axis (L1) remains between the mounting device (31) and the holder (26), and wherein the mounting device (31) comprises at least one mounting magnet (40, 41, 42) that is configured to cooperate with at least one holding magnet (55, 56, 57) in the contact position (P) so that a magnetic axial force (FA) parallel to the first longitudinal axis (L1) is created between the mounting device (31) and the holder (26) and that a magnetic circumferential force (FU) in a circumferential direction (U) around the first longitudinal axis (L1) is created between the mounting device (31) and the holder (26) until a predefined rotational position (R) around the first longitudinal axis (L1) is reached between the mounting device (31) and the holder (26).

2. The probe unit according to claim 1, wherein the mounting device (31) comprises a stop surface (43) that abuts against a counter-stop surface (60) of the holder (26) in the predefined rotational position (R).

3. The probe unit according to claim 1, whereby the at least one mounting magnet (40, 41, 42) comprises a magnet axis (B1, B2, B3) that is oriented parallel to the first longitudinal axis (L1).

4. The probe unit according to claim 1, whereby the mounting device (31) comprises multiple mounting magnets (40, 41, 42) that are regularly distributed around the first longitudinal axis (L1) in a circumferential direction (U).

5. The probe unit according to claim 4, wherein a polarity of at least two of the multiple mounting magnets (40, 41, 42) is opposite to a polarity of another of the multiple mounting magnets.

6. The probe unit according to claim 1, wherein the contact unit (32) comprises a contact surface (34) that comprises at least one conical surface section that extends at least partially about the first longitudinal axis (L1).

7. The probe unit according to claim 6, wherein the contact surface (34) comprises multiple conical surface sections (34a) arranged at a distance with respect to one another in the circumferential direction (U).

8. The probe unit according to claim 7, wherein the mounting device (31) comprises a stop surface (43) that abuts against a counter-stop surface (60) of the holder (26) in the predefined rotational position (R), and wherein the stop surface (43) is arranged between two of the multiple surface sections (34a) that are adjacent to one another in the circumferential direction (U).

9. The probe unit according to claim 1, wherein the at least one mounting magnet (40, 41, 42) is arranged closer to the first longitudinal axis (L1) than the contact unit (32).

10. A holder (26) of a measurement apparatus (20) for attachment of a probe unit (27) on the measurement apparatus (20) that is configured to detect a measurement value at a measurement location of an object surface (21) in a contacting or contactless manner, wherein the holder (26) comprises:
a holding body (50),
a counter-contact unit (51) on the holding body (50) that defines a longitudinal axis (L2) and that is configured to abut against a contact unit (32) of a mounting device (31) of a probe unit (27) in a contact position (P) so that a rotational degree of freedom around the longitudinal axis (L2) remains between the mounting device (31) and the holder (26) and wherein the holder (26) comprises at least one holding magnet (55, 56, 57) that is configured to cooperate with at least one mounting magnet (40, 41, 42) of the mounting device (31) in the contact position (P) so that a magnetic axial force (FA) parallel to the longitudinal axis (L2) is created between the holder (26) and the mounting device (31) and that a magnetic circumferential force (FU) in a circumferential direction (U) around the longitudinal axis (L2) is created between the holder (26) and the mounting device (31) until a predefined desired rotational position (R) around the longitudinal axis (L2) is reached between the holder (26) and the mounting device (31).

11. The holder according to claim 10, wherein the at least one holding magnet (55, 56, 57) comprises a magnet axis (H1, H2, H3) that is oriented parallel to the longitudinal axis (L2).

12. The holder according to claim 10, wherein the at least one holding magnet comprises multiple holding magnets (55, 56, 57) that are regularly distributed in the circumferential direction (U) around the longitudinal axis (L2).

13. The holder according to claim 12, wherein a polarity of at least two of the multiple holding magnets (55, 56, 57) is opposite to a polarity of another of the multiple holding magnets.

14. The holder according to claim 10, wherein the counter-contact unit (51) comprises a counter-contact surface (53) that defines a truncated conical surface portion that extends at least partially about the longitudinal axis (L2).

15. The holder according to claim 10, wherein the at least one holding magnet (55, 56, 57) is arranged closer to the longitudinal axis (L2) than the counter-contact unit (51).

16. An arrangement comprising:
a probe unit (27), and
a holder (26) of a measurement apparatus (20), wherein the measurement apparatus is configured to detect a measurement value at a measurement location of an object surface (21) in a contacting or contactless manner,
wherein the probe unit (27) comprises:
   a support (28),
   a probe element (29) arranged on the support (28) configured for probing the object surface (21) in a contacting or contactless manner, and
   a mounting device (31) provided on the support (28) configured to be mechanically connected with the holder (26) of the measurement apparatus (20), wherein the mounting device (31) comprises a contact unit (32) defining a first longitudinal axis (L1) and wherein the mounting device (31) comprises at least one mounting magnet (40, 41, 42),
wherein the holder (26) comprises;
   a holding body (50),
   a counter-contact unit (51) provided on the holding body (50) defining a second longitudinal axis (L2), and
   at least one holding magnet (55, 56, 57),
   wherein the at least one mounting magnet (40, 41, 42) and the at least one holding magnet (55, 56, 57) repel one another in a rotational position range around the respective first and second longitudinal axes (L1, L2), and attract one another in another rotational position range around the respective first and second longitudinal axes (L1, L2).

* * * * *